United States Patent [19]
Rajeevakumar

[11] Patent Number: 5,489,544
[45] Date of Patent: Feb. 6, 1996

[54] METHOD FOR MAKING A HIGH CAPACITANCE MULTI-LEVEL STORAGE NODE FOR HIGH DENSITY TFT LOAD SRAMS WITH LOW SOFT ERROR RATES

[75] Inventor: Thekkemadathil V. Rajeevakumar, Scarsdale, N.Y.

[73] Assignee: International Business Machines Corporation, Armonk, N.Y.

[21] Appl. No.: 386,845

[22] Filed: Feb. 10, 1995

Related U.S. Application Data

[62] Division of Ser. No. 289,155, Aug. 11, 1994.

[51] Int. Cl.⁶ .................................. H01L 21/8244
[52] U.S. Cl. .................. 437/52; 437/60; 437/915
[58] Field of Search ................... 437/47, 48, 52, 437/60, 915, 67, 381, 903, 904

[56] References Cited

U.S. PATENT DOCUMENTS

| | | | |
|---|---|---|---|
| 4,876,215 | 10/1989 | Hsu | 437/47 |
| 4,890,144 | 12/1989 | Teng et al. | 357/23.4 |
| 4,987,090 | 1/1991 | Hsu et al. | 437/47 |
| 4,997,783 | 3/1991 | Hsu | 437/52 |
| 5,016,070 | 5/1991 | Sundaresan | 357/23.6 |
| 5,145,799 | 9/1992 | Rodder | 437/47 |
| 5,179,033 | 1/1993 | Adan | 437/41 |
| 5,187,114 | 2/1993 | Chan et al. | 437/52 |
| 5,198,683 | 3/1993 | Sivan | 257/67 |
| 5,204,279 | 4/1993 | Chan et al. | 437/47 |

FOREIGN PATENT DOCUMENTS 0161659 8/1985 Japan.

OTHER PUBLICATIONS

"High Density SRAM Structure with a New Three–Dimensional, High–..." J. P. Gambino et al IBM Tech. Disc. Bul. V. 34 #2 Jul. 1991 pp. 255–258.
"High–Density CMOS SRAM Cell" W. H. Chang IBM Tech. Disc. Bulletin V. 34 #6 Nov. 1991 pp. 95–96.
"High Density Thin Film Transistor Load SRAM Cell Using Trench..." T. V. Rajeevakumar IBM Tech. Disc. Bul. V. 36 #09A Sep. 1993 pp. 581–582.

*Primary Examiner*—Tom Thomas
*Attorney, Agent, or Firm*—Robert P. Tassinari, Jr.

[57] ABSTRACT

A method for making high capacitance multi-level storage node contact is proposed for high density SRAMs. The proposed contact connects several poly levels to diffusion and to a trench capacitor, in one contact. The high storage node capacitance provided by the trench capacitor substantially reduces the soft error rate probability of the cell. The use of a single contact to connect several levels reduces the area. The contact preferably uses TiN as a barrier layer to reduce dopant diffusion between different poly layers.

7 Claims, 7 Drawing Sheets

METHOD FOR MAKING A HIGH CAPACITANCE MULTI-LEVEL STORAGE NODE FOR HIGH DENSITY TFT LOAD SRAMS WITH LOW SOFT ERROR RATES

CROSS REFERENCE TO RELATED APPLICATION

This is a divisional of application Ser. No. 08/289,155, filed Aug. 11, 1994.

FIELD OF THE INVENTION

The invention relates to SRAM devices, and in particular to a method for making a multi-level storage node for such devices.

BACKGROUND OF THE INVENTION

As the SRAM cell is scaled towards the 64 Mb SRAM and beyond, innovative cell concepts are needed to push the cell area to practical limits. When the cell area is scaled down, the storage node capacitance is also reduced, resulting in higher soft error rates. Exposure to naturally occurring radiation can alter the charge stored at the storage (latch) node, and can change the data stored. Fast SRAMs require lower Soft Error Rates ("SER"), because fast dedicated caches tend to rely less on Error Correction Coding ("ECC"), which are required to compensate for high SER's.

Several schemes have been proposed in the past to reduce soft errors in SRAMs. One scheme involves the placement of a stacked capacitor between the input/output and the latch nodes. (See, for example, U.S. Pat. Nos. 5,016,070 and 5,145,799.) However, such a capacitor increases the noise coupling between the input/output and the latch (storage) nodes, thereby increasing the noise susceptibility of the cell. In addition, the capacitance associated with the stacked capacitor is limited, and the stacked capacitor introduces planarization problems.

In accordance with the present invention, the soft error and other stability problems associated with the scaling down of SRAMs to higher and higher densities can be eliminated by placing a trench storage capacitor under each of the latch nodes, and connected to the latch nodes. The capacitor is between the latch node and the ground, and so does not increase noise from inputs. The node capacitance can be arbitrarily increased without increase in cell area by increasing the trench depth. Prior designs have placed a capacitance across the bitline access device in an attempt to reduce soft error rates. This technique has proven to be ineffective, however, because high frequency noise can pass from input/output through such capacitors, resulting in errors. In accordance with the present invention, however, because device stabilization is achieved through a capacitance connected to ground, where no such high frequency noise exists, better cell stability is achieved.

In addition, a novel multi-layer contact proposed here reduces the cell area.

SUMMARY OF THE INVENTION

The present invention is a method for making an improved SRAM cell, the method comprising:

providing a substrate;

forming a capacitor in the substrate;

forming a first diffusion area in the substrate adjacent the capacitor;

forming a first gate node on the storage node;

forming a second diffusion area in the substrate spaced from the first diffusion area;

forming a second gate node contacting the first and second diffusion areas;

forming a third gate node contacting the second diffusion area;

forming a contact on the second diffusion area and electrically isolated from the first and second gate nodes;

forming an insulator layer on the first, second and third gate nodes, the contact and the exposed surface of the substrate;

forming a polysilicon gate layer on the insulator layer;

forming a polysilicon body on the polysilicon gate layer;

forming a single contact electrically connecting the capacitor to each of the diffusion area, the first gate poly node, the polysilicon gate layer and the polysilicon body.

DETAILED DESCRIPTION OF THE INVENTION

Figure 1:
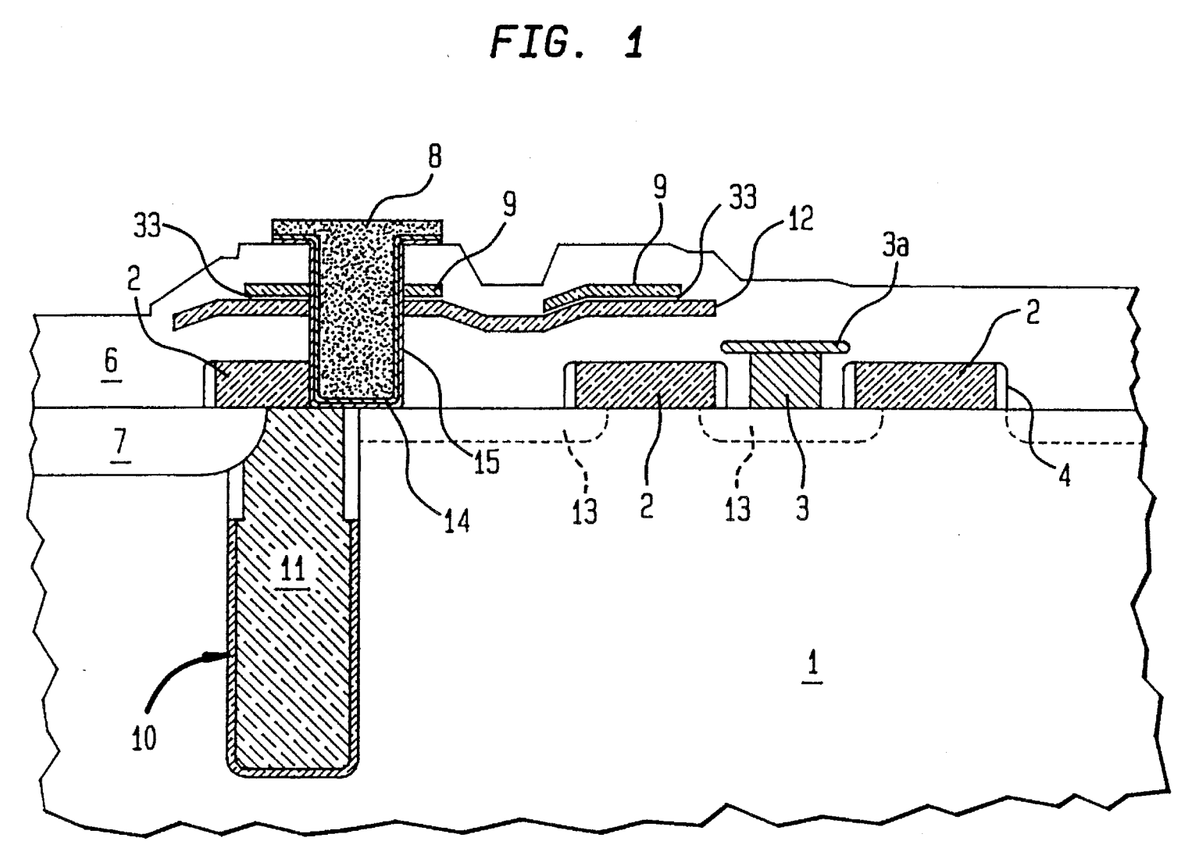
FIG. 1 is a schematic vertical structure of one latch node of an SRAM cell according to the invention.

FIG. 1 is a schematic vertical structure of one node of an SRAM cell according to the invention, showing one of the multi-level poly-diffusion-trench contacts in such a cell, as well as a capacitor between the latch node and ground to reduce soft error rates. The cell cross-section of FIG. 1 includes substrate contact 1, multi-level poly-diffusion-trench contact 8, gate poly 2, ground contact 3, ground line 3a, oxide spacer 4, deposited oxide 6, LOCOS ("LOCal Oxidation of Silicon") isolation 7, TFT ("Thin Film Transistor") body poly 9, capacitor dielectric 10, trench poly node 11 inside the capacitor dielectric 10, TFT gate poly 12, diffusion 13, TiSi$_2$ layer 14, and TiN layer 15.

Substrate 1 is preferably a p+ silicon substrate with a p– epitaxial layer near the surface. The p– layer is advantageous because it allows formation of n diffusion region 13 through a later diffusion step. Alternatively, substrate 1 can be an n+ silicon substrate with an n– epitaxial layer near the surface, allowing p diffusion.

In accordance with the present invention, multi-level contact 8 connects: (1) the trench capacitor node 11, (2) the diffusion 13, (3) the gate poly 2, (4) the gate poly 12 of the PMOS load TFT, and (5) the body poly 9 of the PMOS load TFT (100 in FIG. 14). In one preferred embodiment, the hole occupied by contact 8 has an inner lining of TiSi$_2$ and TiN layers 14 and 15. The contact itself is made from either polysilicon, or a metal such as Tungsten or Aluminum. Tungsten is the preferred material. The TiN and TiSi$_2$ layers provide good electrical contact between the contact 8 and the various elements described above while providing a diffusion barrier to prevent any dopant diffusion from one poly layer to another (for instance from body poly 9 to gate poly 12). TaN can be used in place of the TiN layer, although TiN is preferred.

Figure 14:
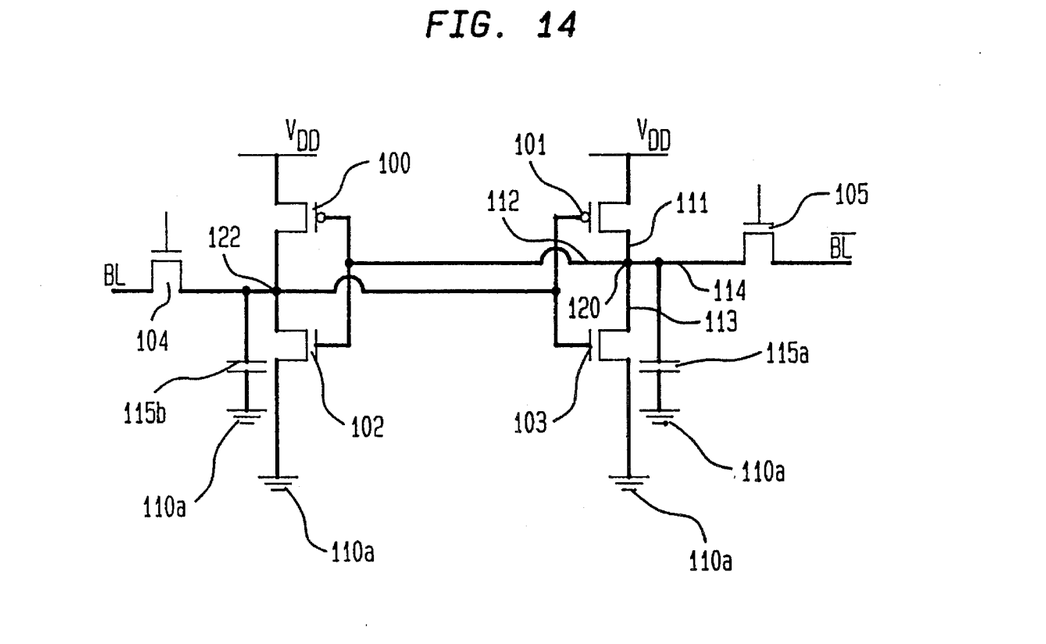
FIG. 14 is a schematic diagram of the electrical circuit formed by the device of the present invention.

Each of the gate polysilicon layers 2 provide, in a preferred embodiment, a separate gate for the four n-channel devices of the cell shown in FIG. 14. Ground contact 3 of FIG. 1 corresponds to ground contacts 110a and 110b in FIG. 14. Ground contact 3 is made from tungsten, aluminum or other metal, although tungsten is preferred.

Spacers 4 protect the poly gate from contact with other logic devices. These spacers preferably are about 200 angstroms in thickness.

Deposited oxide 6 insulates layer 12 from contact 3, poly gate 2 and the silicon surface 1.

LOCOS isolation layer 7 electrically isolates diffusion 13 from other diffusion areas.

TFT body poly 9, along with TFT gate poly 12 form transistor 100 in FIG. 14. TFT gate poly 12 also acts as the gate for transistor 101 of FIG. 14.

Capacitor dielectric 10 provides capacitance for the trench between polysilicon node 11 and poly contact 1 (ground), to provide electrical (charge) stability for the latch nodes of the cell. The high capacitance introduced by the dielectric 10 (which can be oxide, silicon nitride or a composite of the two) ensures that the amount of charge associated with each latch node is comparatively much higher than any amount of radiation-induced noise charge collected by the latch node. This stability of charge, therefore, ensures stability of the cell. A thicker capacitor dielectric 10 may be used to increase the reliability. The thickness of layer 10 preferably is approximately 50–80 angstroms. The storage node capacitance of layer 10 preferably will be between 30 fF to 100 fF, depending on the trench depth and the thickness of the capacitor dielectric. While only one storage node and latch node with a multi-level contact between them are shown in the figure for convenience, it will be understood that an SRAM cell will have two such nodes.

An alternative way of adding capacitance is to provide a capacitor after cell processing, for instance by providing a ground plane above contact 8.

The collar 31, consisting of a thick oxide, protects the oxidized surface of the capacitor trench from degradation during processing.

Figure 2:
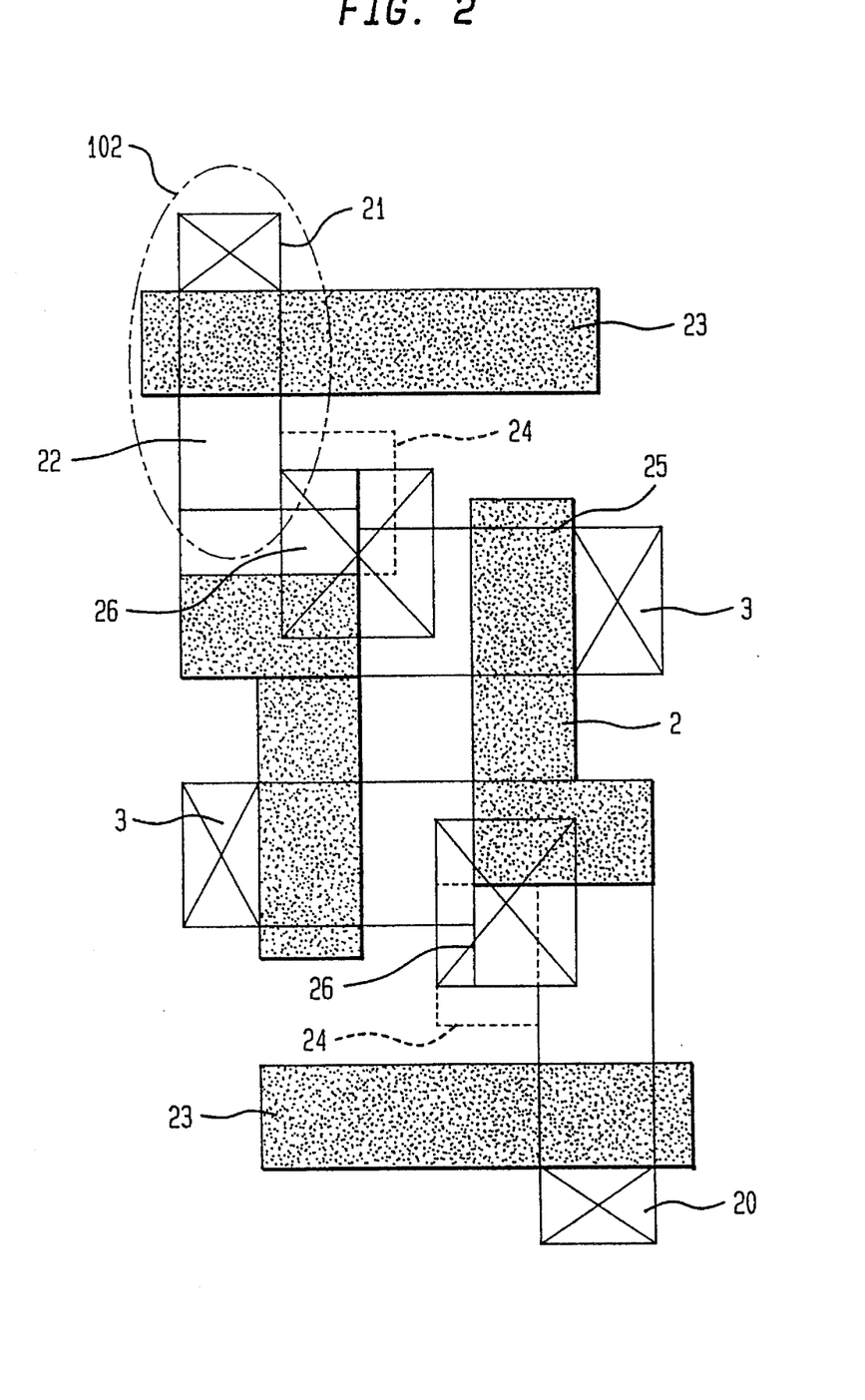
FIG. 2 shows a top view (layout) of the SRAM cell of FIG. 1.

FIG. 2 shows a top view (layout) of the SRAM cell of FIG. 1. The gate and body of the TFT are not shown, for reasons of clarity. The top view shows word line 23, diffusion area 22, bitline 20, complementary bitline 21, trench 24, NMOS driver 25, and poly-diffusion-trench contact 26. The contact 8 in FIG. 1 corresponds to contact 26 in FIG. 2. The cell is symmetric, with split word line layout. The ground contact 3 and the bit line contacts 20 and 21 can be made borderless to gate poly 2. A resistive region may be formed in the diffusion 22 between the poly-diffusion-trench contact 26 and the access transistor 102 to reduce the cell ratio for stable low voltage operation.

A cell area of about 40 lithographic squares may be achieved for the type of cell layout shown in FIG. 2. A preferred method of fabricating the structure of FIGS. 1 and 2 is now described.

Figure 3:
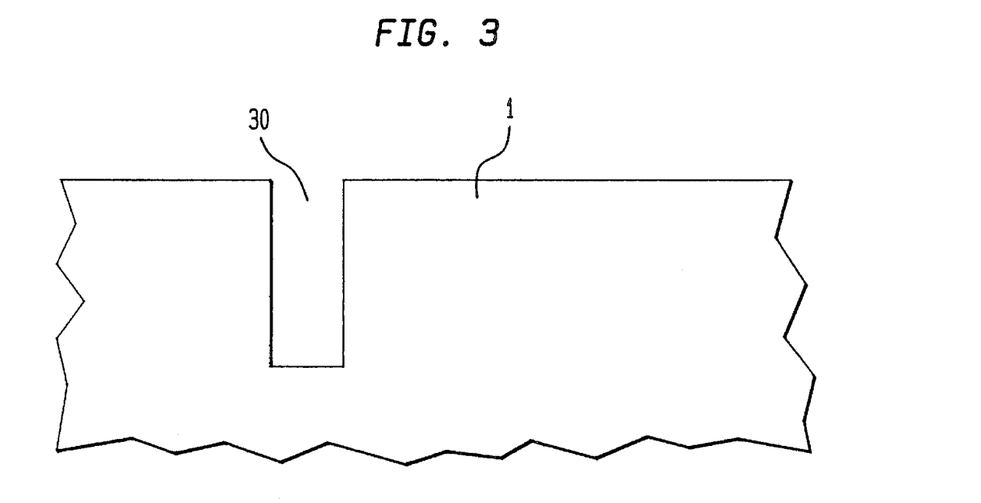
FIGS. 3–7, 8, 8a, 9–13 show the sequential process steps for fabricating an SRAM cell in accordance with the present invention.
Figure 4:
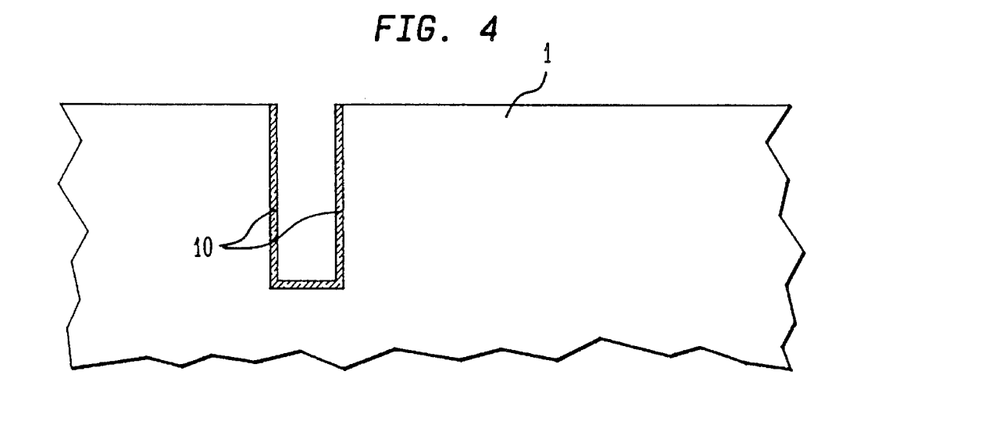

Referring to FIG. 3, first the trench capacitor is formed using conventional methods. For this, a trench 30 is etched (preferably using reactive ion etching, RIE) in substrate 1 to an appropriate depth, depending upon the size of the opening and the desired capacitance. In a preferred embodiment, the depth will be approximately 10 microns for a 0.5 micron opening.

Next is the formation of capacitor dielectric 10 inside the trench. This capacitor dielectric is formed as follows. The dielectric is preferably a three layer composite. First, the trench is oxidized by introducing oxygen into the trench. Next, nitrogen is introduced at high temperature to form silicon nitride. Finally, a silicon nitride is oxidized to form a composite layer of oxide-nitride-oxide (ONO).

Figure 5:
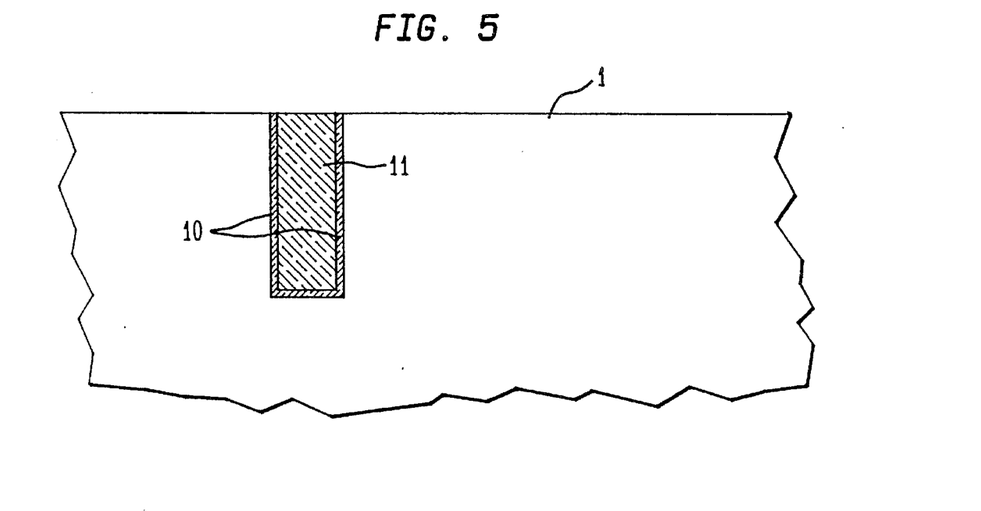

Trenches are then refilled with poly (node 11) and planarized, as shown in FIG. 5. To fill the trench 30 with silicon, silicon layers are repeatedly deposited on the entire structure at low temperature and low pressure to avoid the formation of voids, until the trench has been filled. The silicon on the upper surface of the substrate is then electro-mechanically polished, and etched to form the structure of FIG. 5. Alternatively, after the repeated blanket deposition of poly, during which an indentation will form on the upper surface corresponding to the location of the hole 30, the indentation can be filled with a photo-resist material, and the entire layer of silicon, together with the photoresist, can be RIE'ed.

Next, collars 31 are formed. To do this, the upper portion of the polysilicon forming the storage node 11 is first etched by RIE to recess the poly to a desired depth. Next, oxide is deposited on the entire surface of the device, masked, and anisotropically RIE'd to leave the oxide only on the horizontal surfaces of the hole 30. The oxide layer on the horizontal surfaces forms collar 31. The hole is then filled with poly silicon again and planarized.

Figure 6:
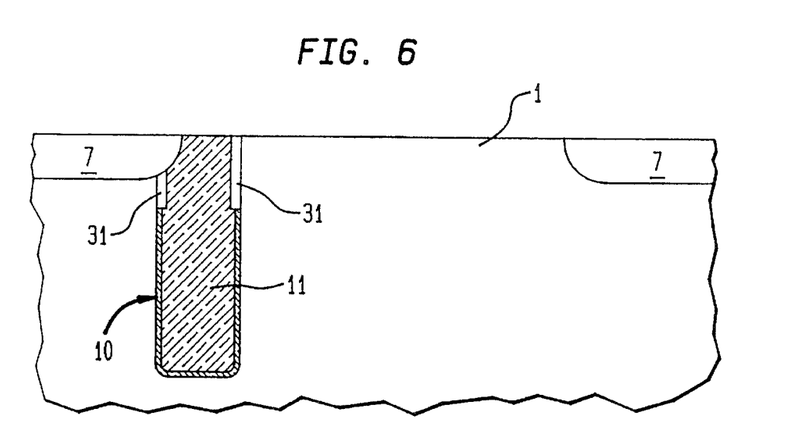

Next, LOCOS 7, which provides device isolation, is formed by recessing the silicon in the desired location of LOCOS 7 and oxidizing the recess. Alternatively, a shallow trench can be etched in the desired location of LOCOS 7 and the trench filled with oxide. The latter technique, known as shallow trench isolation, is preferred. At this point, the structure is as shown in FIG. 6.

Figure 7:
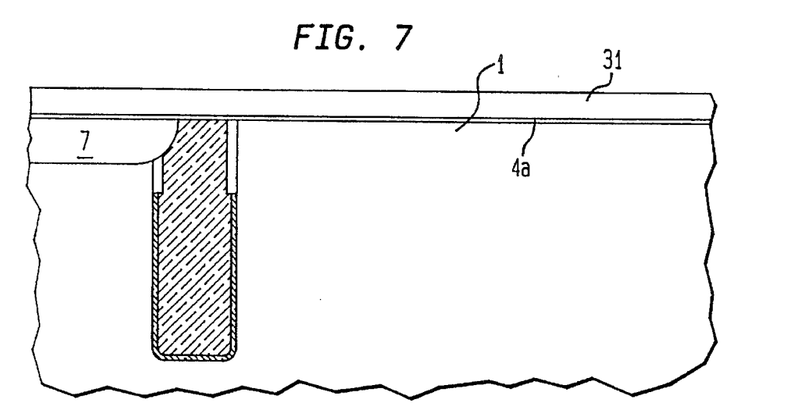
Figure 8:
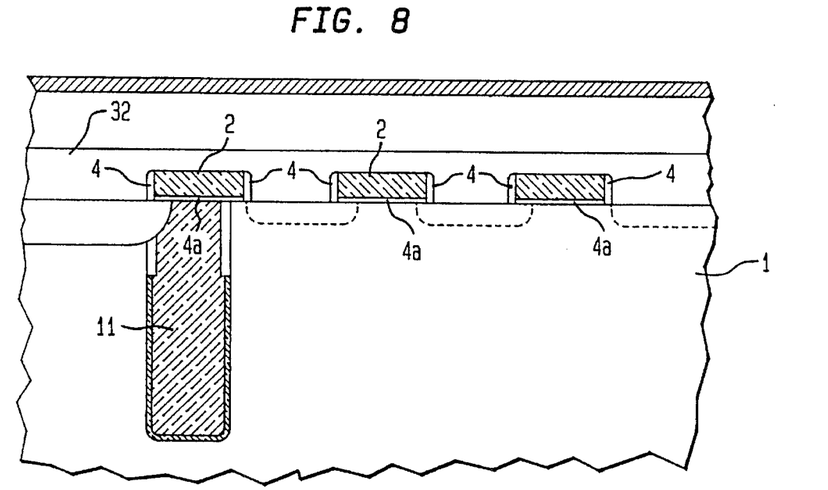

Next, referring to FIG. 7, gate oxide layer 4a is formed by blanket oxidation, followed by gate poly layer 31 deposition and patterning to form gate poly 2, as shown in FIG. 8. Diffusion area 13 is then produced by phosphorous ion implantation. Oxide spacers 4 are then formed to the gate poly by depositing a thin layer of oxide on the device and anisotropically RIE'ing the oxide to leave the oxide spacers on the horizontal surfaces of the poly contacts 2.

Figure 8A:
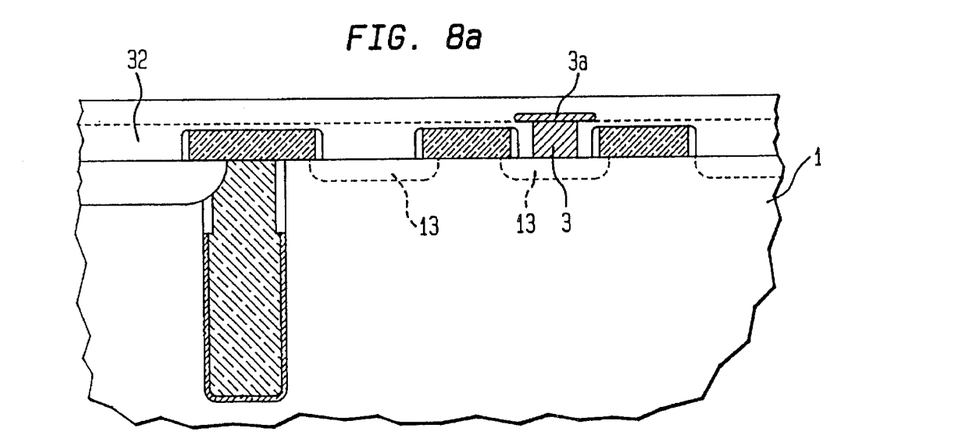
Figure 9:
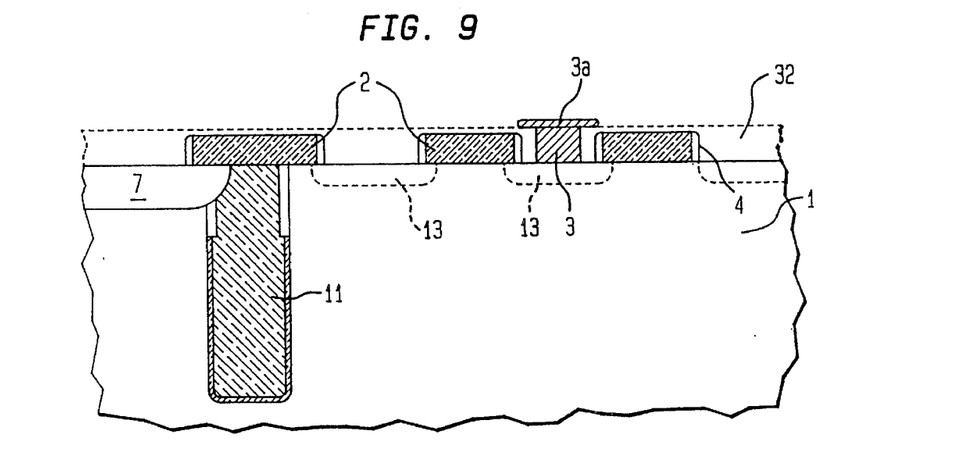

A layer of TEOS 32 is deposited next and etched above diffusion area 13 in the region in which contact 3 is desired. The etched region is then filled with metal to form contact 3, as shown in FIG. 8a, followed by ground line 3a patterning, resulting in the structure of FIG. 9.

Figure 10:
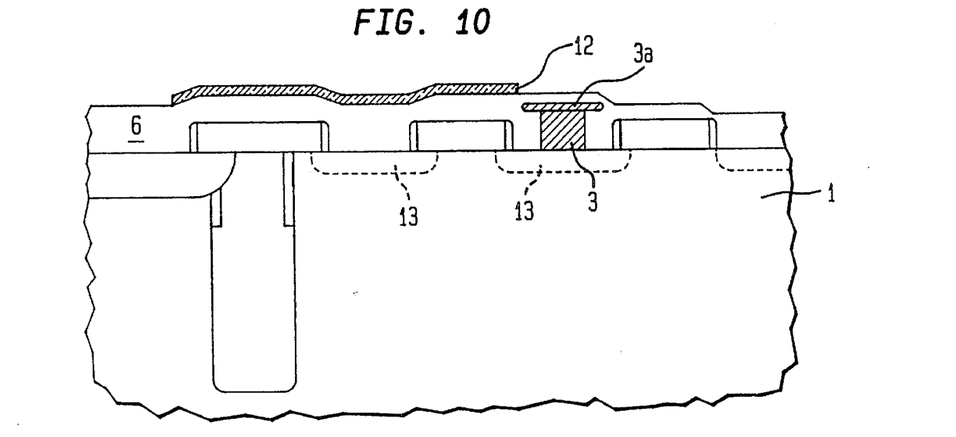
Figure 11:
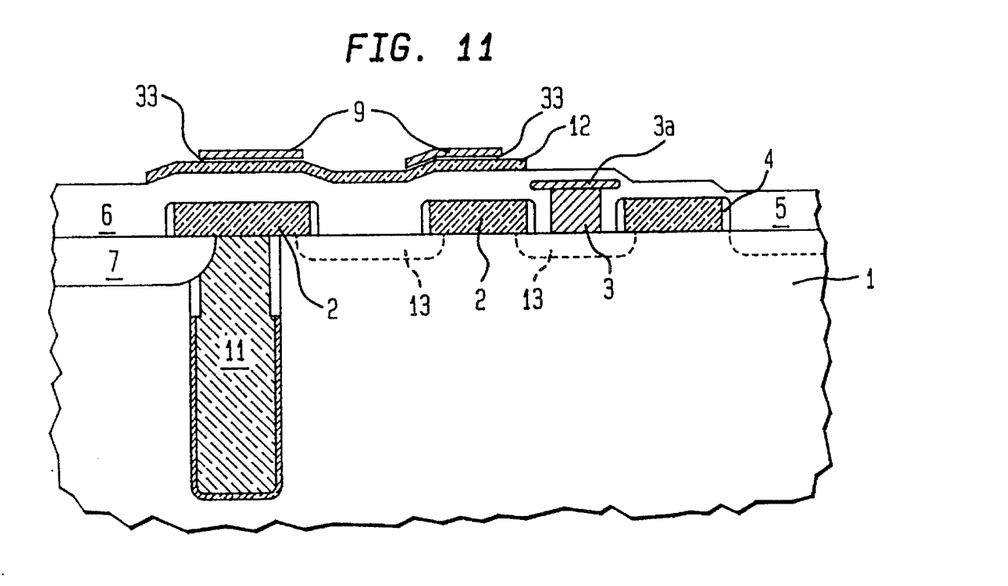

Next, as shown in FIG. 10, another layer of TEOS 6 is deposited to isolate the ground line 3a and contact 3, followed by the deposition and patterning of TFT gate poly 12 by depositing and patterning. Gate oxide 33, shown in FIG. 11, is formed on the TFT gate poly 12 by oxidization, and then TFT body poly 9 is deposited and patterned.

Figure 12:
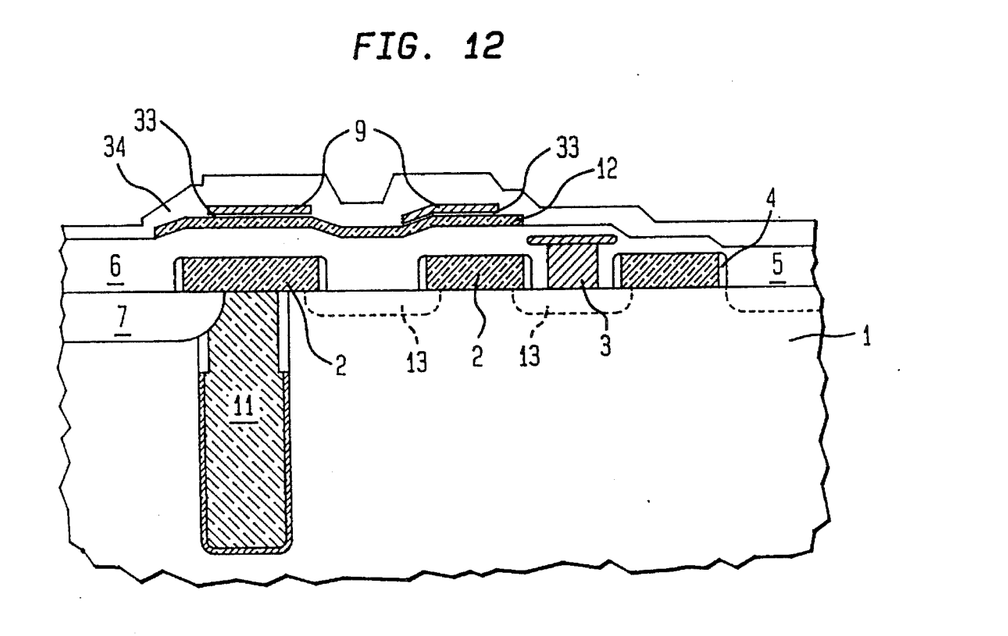
Figure 13:
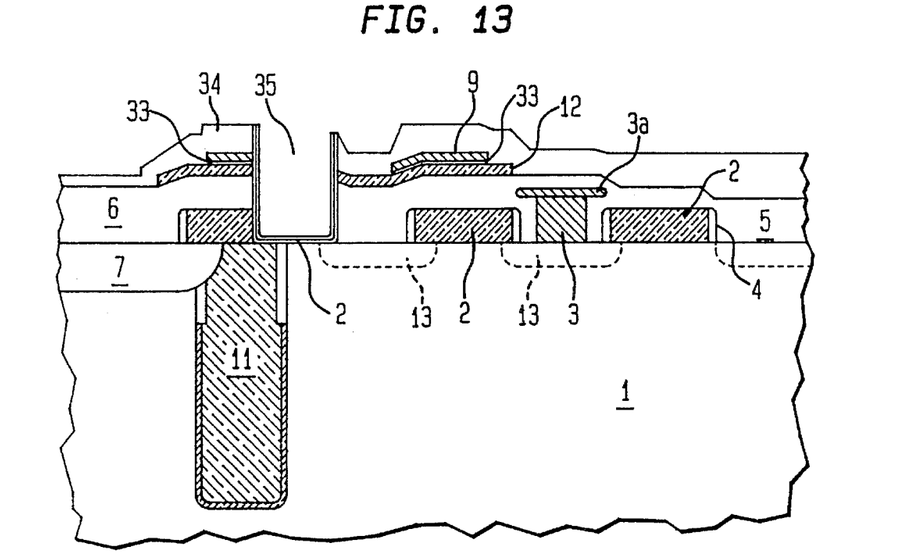

A layer of TEOS 34 is then blanketly deposited, as shown in FIG. 12. Trench contact hole 35 is patterned and sequentially anisotropically RIE'ed through the various layers to stop finally on the substrate 1. Next, boron ion implantation is performed at the bottom of hole 35 to extend the diffusion area 13 for better contact with the bottom of the contact 8. Hole 35 is then lined with $TiSi_2$ and TiN 14 and 15 before being filled with poly or metal, as shown in FIG. 1. Contact 8 is then patterned to contact TFT body poly 9 and power supply (VDD) wiring.

Referring now to FIG. 14, a schematic of an SRAM cell in accordance with the invention will be described. The cell comprises p-type devices 100 and 101, and n devices 102 and 103. Also provided are n-type access devices 104 and 105. During a write operation, the access devices 104 and 105 are on and the data is written into the cell. During a read operation, again the devices 104 and 105 are on and the sense amplifier is set as per the data stored in the cell. The storage node 120 corresponds to the vertical contact 8 of FIG. 1. The storage node connects diffusion contact 111 (corresponding to 9 in FIG. 1), the gate contact 112 (corresponding to 12 in FIG. 1), diffusion contact 113 (corresponding to one diffusion area 13 in FIG. 1), another diffusion contact 114 (corresponding to another diffusion area in FIG. 1), and trench capacitor 115a (corresponding to the polysilicon plate 11 in FIG. 1). 110a is the ground.

The operation of the circuit of FIG. 14 is as follows. When the input BL is High (and hence BL bar is low), data will be read into the cell when the gates of transistors 104 and 105 go high. The storage node 122 will go high because BL bar is low, turning on transistor 100 and turning off transistor 102. This will cause node 122 to rise to a potential of $V_{DD}$. At the same time, the high input from access transistor 122 will turn transistor 101 off and transistor 103 on, placing node 120 at ground potential.

While the invention has been described particularly with respect to preferred embodiments thereof, it will be understood by those skilled in the art that modifications can be made without departing from the spirit and scope of the invention.

I claim:

1. A method of fabricating an SRAM cell, comprising:

providing a substrate;

forming a trench in the substrate;

forming a capacitor in the trench;

forming a first diffusion area in the substrate proximate the capacitor;

forming a second diffusion area in the substrate proximate the first diffusion area;

forming a first gate insulator on the capacitor and the first diffusion area;

forming a first gate electrode on the first gate insulator;

forming a second gate insulator contacting the first and second diffusion areas;

forming a second gate electrode on the second gate insulator;

forming a third gate insulator contacting the second diffusion area;

forming a third gate electrode on the third gate insulator;

forming a contact on the second diffusion area between the first and second gate electrodes;

forming an insulator layer on the first gate node, the second gate node, the third gate node, the contact and exposed portions of the substrate;

forming a polysilicon gate layer on the insulator layer;

forming a gate insulator layer on the gate layer;

forming a polysilicon body on the polysilicon gate insulator layer;

forming a single contact through the polysilicon body, the single contact electrically connecting the capacitor to each of the diffusion area, the first gate electrode, the polysilicon gate layer and the polysilicon body.

2. The method of claim 1, wherein the step of forming a capacitor in the trench comprises:

lining the trench with dielectric material;

filling the trench with a conductive material.

3. The method of claim 1, wherein the single contact is vertically disposed in the SRAM cell.

4. The method of claim 3, further comprising substantially surrounding the vertical contact with a diffusion barrier layer.

5. The method of claim 3, wherein the step of forming a capacitor in the trench comprises:

lining the trench with dielectric material;

filling the trench with a conductive material.

6. The method of claim 1, wherein the polysilicon body is disposed directly above the first gate electrode, the first diffusion area and the second gate electrode.

7. The method of claim 1, wherein forming a single contact comprises etching portions of the polysilicon body, the gate insulator layer, the polysilicon gate layer, the insulator layer, the first gate electrode and the first gate insulator to expose a portion of the capacitor, thereby forming a single contact trench in the cell;

lining the single contact trench with a layer of $TiSi_2$ and then a layer of TiN to form a lined trench;

filling the lined trench with polysilicon.

* * * * *